(12) United States Patent
Cho et al.

(10) Patent No.: US 6,583,037 B2
(45) Date of Patent: Jun. 24, 2003

(54) METHOD FOR FABRICATING GATE OF SEMICONDUCTOR DEVICE

(75) Inventors: Sung-Yoon Cho, Seoul (KR); Bum-Jin Jun, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/212,312

(22) Filed: Aug. 5, 2002

(65) Prior Publication Data

US 2003/0049567 A1 Mar. 13, 2003

(30) Foreign Application Priority Data

Aug. 7, 2001 (KR) .......................... 2001-47461

(51) Int. Cl.$^7$ .................. G03C 5/00; H01L 21/3205
(52) U.S. Cl. .................. 438/585; 438/949; 430/318; 430/319
(58) Field of Search .................. 438/585, 587, 438/948, 949; 430/311, 314, 315, 318, 319

(56) References Cited

U.S. PATENT DOCUMENTS 5,824,596 A  10/1998 Naem
6,207,541 B1 * 3/2001 Das et al. .................. 438/585
6,326,290 B1  12/2001 Chiu
6,387,787 B1 * 5/2002 Mancini et al. ............. 438/586

FOREIGN PATENT DOCUMENTS

JP  03-276627  12/1991

* cited by examiner

*Primary Examiner*—Richard Booth
(74) *Attorney, Agent, or Firm*—Ladas & Parry

(57) ABSTRACT

Disclosed is a method for fabricating a gate of semiconductor device. The disclosed comprises the steps of: sequentially forming a gate oxide layer, a gate material layer and a mask oxide layer on a semiconductor substrate; coating photopolymer having compound accelerator including polar functional group which absorbs HF vapor and ionize at a predetermined high temperature on the mask oxide layer; exposing the photopolymer and cross-linking the portion of exposed photopolymer; performing DFVP process by passing over HF vapor on the resultant substrate at a predetermined high temperature, thereby developing the portion of exposed photopolymer and etching the portion of mask oxide layer exposed by development of photopolymer simultaneously; removing the residual photopolymer; and etching the gate material layer and the gate oxide layer using the etched mask oxide layer.

4 Claims, 2 Drawing Sheets

(CD1=CD2)

(CD1=CD2)

METHOD FOR FABRICATING GATE OF SEMICONDUCTOR DEVICE

BACKGROUND OF THE INVENTION

1. Field of the Invention

The present invention relates to a method for fabricating a gate of semiconductor device and, more particularly, to a method for fabricating a gate of semiconductor device capable of preventing generation of critical dimension CD difference between pattern densed region and isolated region.

2. Description of the Related Art

As a semiconductor device is highly integrated, line width of a gate becomes reduced with the cell size. Therefore, research and efforts are focused on development of gate realizing low resistance with fine line width.

Generally, polysilicon has been widely employed as a gate material, which has limitations in realizing low resistance on the gate having fine line width. Therefore, polycide gate has been proposed to realize low resistance with fine line width and recently, research is in progress on the development of metal gate.

The polycide gate or metal gate has been obtained by a conventional art including the following steps.

A gate oxide layer and a gate material layer are sequentially formed on a semiconductor substrate, wherein the gate material layer is a stacked layer comprising a polysilicon layer and a metal silicide layer or a stacked layer comprising a polysilicon layer, a barrier layer and a metal layer. A mask oxide layer is formed on the gate material layer.

A photoresist pattern is formed on the mask oxide layer via coating, exposure and development procedures to define a gate formation region. The mask oxide layer is etched in a shape of resist pattern.

Then, the residual photoresist pattern is removed. The gate material layer and the gate oxide layer are etched in accordance with a RIE (Reaction Ion Etching) process using the etched mask oxide layer as an etch barrier, thereby forming a polycide or a metal gate realizing low resistance with fine line width.

However, in the conventional method, there is a problem that pattern CD difference is generated between densed region and isolated region, for example, cell region and peripheral circuit region, as shown in FIG. 1, thereby deteriorating device properties and lowering the yield rate. In FIG. 1, a reference number 1 is a semiconductor substrate, 2 is a gate oxide layer, 3 is a gate material layer, 4 is a mask oxide layer and 10 is a polycide or a metal gate.

That is, the polycide or the metal gate is formed by dry etching the gate material layer using the mask oxide layer as an etch barrier, wherein the mask oxide layer as an etch barrier is etched in a shape of photoresist pattern obtained via photoresist coating, exposure and development procedures.

However, the photoresist pattern may have different CD between cell region and peripheral circuit region due to proximity effect by pattern density during the exposure process.

In this case, the mask oxide layer is etched in a shape of photoresist pattern having CD difference between the regions and therefore, the etched mask oxide layer also has CD difference between the regions. And, the gate material layer is etched by using the mask oxide layer having CD difference as an etch barrier and therefore, the polycide or metal gate also has CD difference between cell region and peripheral circuit region.

As a result, the conventional method has generated CD difference between pattern densed region and isolated region, thereby deteriorating device properties and lowering the yield rate.

To overcome the generation of CD difference between densed region and isolated region, several methods have been proposed including device modification and change of parameter. However, the conventional method has limitations in preventing the CD difference.

SUMMARY OF THE INVENTION

Accordingly, it is the primary objective of the invention to provide a method for fabricating a gate of semiconductor device preventing generation of CD difference between pattern densed region and isolated region.

To accomplish the object, the present invention comprises the steps of: sequentially forming a gate oxide layer, a gate material layer and a mask oxide layer on a semiconductor substrate; coating photopolymer on the mask oxide layer, wherein the photopolymer has compound accelerator including polar functional group which absorbs HF vapor and ionizes at a predetermined high temperature; exposing the photopolymer and crosslinking the portion of exposed photopolymer; performing DFVP process by passing over HF vapor on the resultant substrate at a predetermined high temperature, thereby developing the portion of exposed photopolymer and etching the portion of mask oxide layer exposed by the developed photopolymer, simultaneously; removing the residual photopolymer; and etching the gate material layer and the gate oxide layer using the etched mask oxide layer.

According to the present invention, the photopolymer is a cinnamate type including 5-nitroacenaphthene, described by the following structural formula.

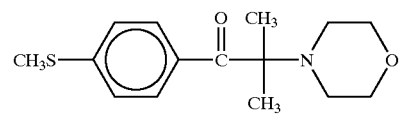

And, the DFVP process is performed at a high temperature over 100° C.

BRIEF DESCRIPTION OF THE DRAWINGS

The above objects, and other features and advantages of the present invention will become more apparent after considering the following detailed description when taken in conjunction with the drawings.

DETAILED DESCRIPTION OF THE INVENTION

An embodiment of the present invention will be now described in more detail with reference to the attached drawings.

Figure 1:
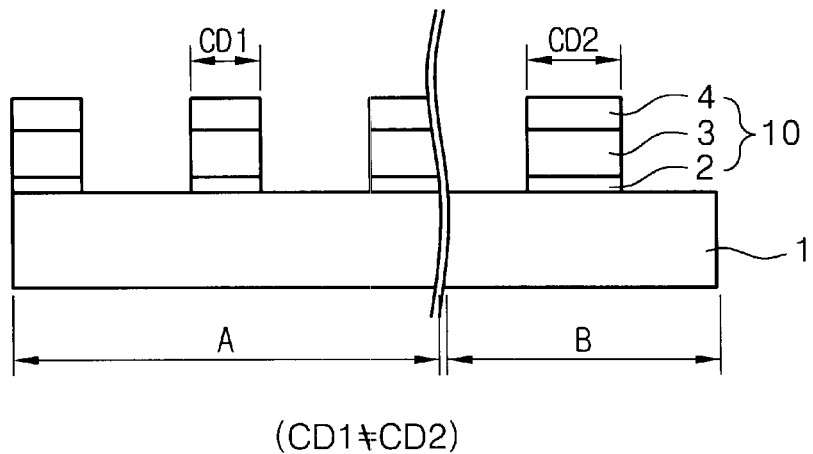
FIG. 1 is a cross sectional view showing a gate formed by a conventional art.
Figure 2A:
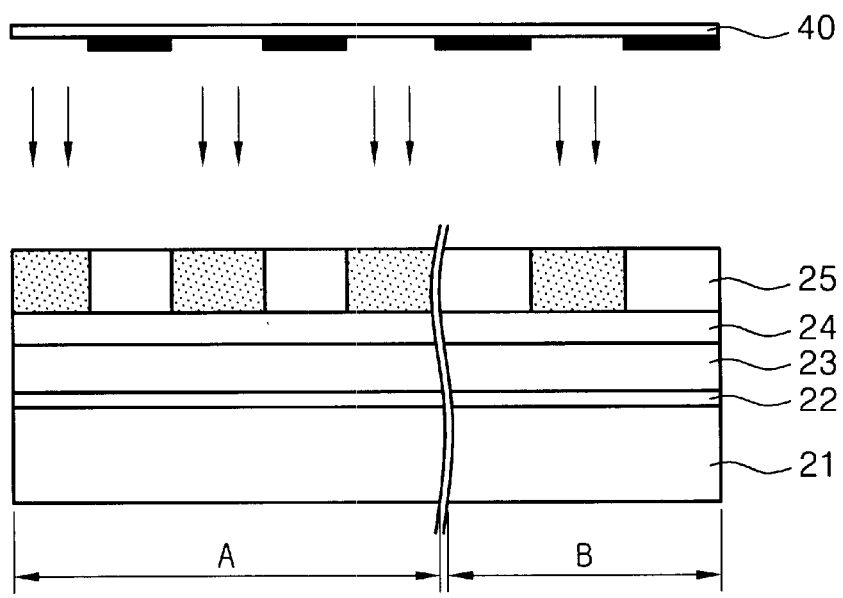
FIGS. 2A to 2C are cross sectional views showing a method for fabricating a gate according to the present invention.

Referring to FIG. 2A, a gate oxide layer 22, a gate material layer 23 and a mask oxide layer 24 are sequentially formed on a semiconductor substrate 1 including pattern densed region and isolated region, that is, a cell region (A) and a peripheral circuit region (B). The gate material layer 23 is desirably a stacked layer comprising a polysilicon layer and a metal silicide layer or a stacked layer comprising a polysilicon layer, a barrier layer and a metal layer.

A cinnamate type photopolymer 25 having accelerator, and including 5-nitroacenaphthene is coated on the mask oxide layer 24. Then, the photopolymer 25 is exposed by using a reticle 40.

The accelerator is a compound including a polar functional group which absorbs HF vapor at a high temperature and ionizes photopolymer, having volatility. The accelerator can be described by a following structural formula.

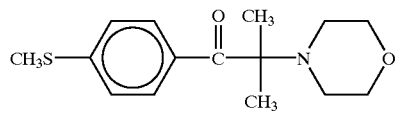

As the result of exposure of the photopolymer 25, the portion of exposed photopolymer is crosslinked.

Figure 2B:
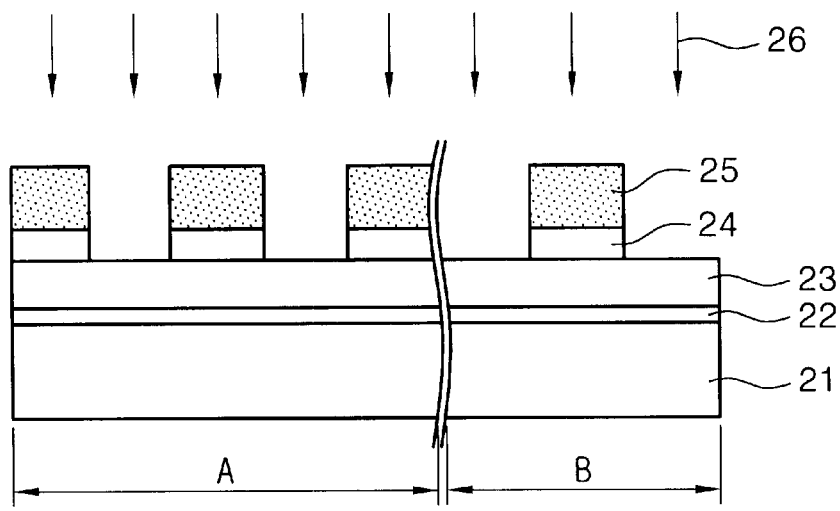

Referring to FIG. 2B, a DFVP (Development Free Vapor Photolithography) process is performed on the resultant substrate by passing over HF vapor 26 at a temperature over 100° C.

During the DFVP process, accelerator in photopolymer is volatilized by heat, wherein accelerator in the portion of unexposed photopolymer is rapidly volatilized while accelerator in the portion of exposed photopolymer is not volatilized since the portion is crosslinked and thereby, preventing rapid escape.

The nonvolatilized accelerator in the portion of exposed photopolymer absorbs HF vapor 26, and operates to ionize photopolymer, thereby developing the portion of exposed photopolymer.

The accelerator absorbs HF vapor and ionizes in a method described by the following equation.

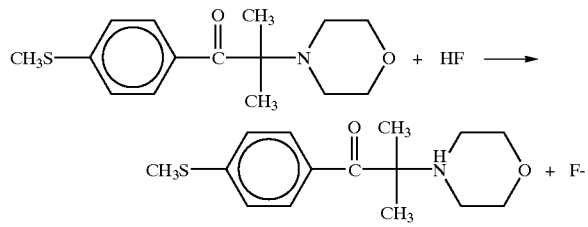

When the portion of exposed photopolymer is developed by DFVP process, the photopolymer is removed and therefore, the portion of exposed mask oxide layer is etched by HF vapor 26. The etch pattern of the mask oxide layer 24 has a slight positive slope.

As a result, during the DFVP process, the portion of exposed photopolymer is developed by difference of accelerator concentration with the portion of unexposed photopolymer and the mask oxide layer thereunder is etched by HF vapor. Therefore, it is possible to prevent generation of CD difference due to difference of pattern density between cell region (A) and peripheral circuit region (B) and thereby, not causing CD difference of mask oxide layer due to photoresist pattern having a problem of CD difference.

Figure 2C:
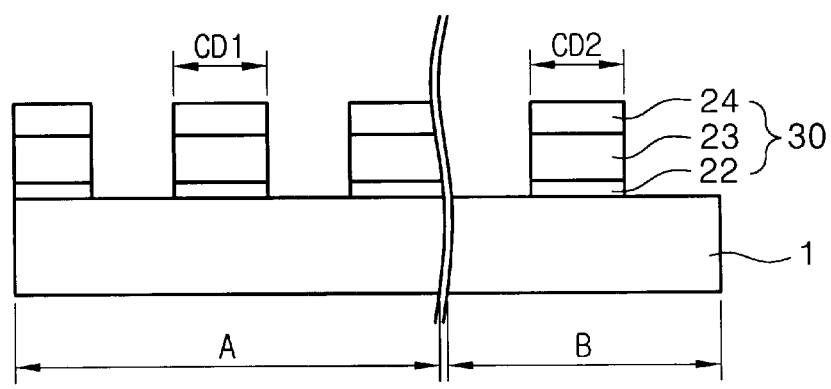

Referring to FIG. 2C, the residual photopolymer pattern is removed. The gate material layer 23 and the gate oxide layer 22 are dry-etched using the etched mask oxide layer 24 as an etch barrier, thereby forming a polycide or a metal gate 30 on the cell region (A) and the peripheral circuit region (B) of the substrate, respectively.

In this case, the gate 30 is formed by dry etching the gate material layer using the mask oxide layer 24 having no CD difference as an etch barrier. Therefore, CD difference is not generated between the cell region (A) and the peripheral circuit region (B).

As described above, according to the present invention, development of photopolymer and etch of mask oxide layer are performed by DFVP process, thereby preventing generation of CD difference between densed region and isolated region due to difference of pattern density. Therefore, the present invention has an advantage that it is possible to form a gate having the same CD on the densed region and the isolated region. As a result, there is an effect of improvements of device properties and the yield rate.

Moreover, according to the present invention, development of photopolymer and etch of mask oxide layer are performed by DFVP process and therefore, it is not required to perform additional steps including pre-bake of photoresist, development of photoresist using developer, post bake of photoresist and etch of mask oxide layer. Accordingly, the manufacturing process can be simplified.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a gate of semiconductor device comprising the steps of:

sequentially forming a gate oxide layer, a gate material layer and a mask oxide layer on a semiconductor substrate;

coating photopolymer having a compound accelerator including a polar functional group which absorbs HF vapor and ionizes at a predetermined high temperature on the mask oxide layer;

exposing the photopolymer and cross-linking the portion of exposed photopolymer;

performing a DFVP process by passing over HF vapor on the resultant substrate at a predetermined high temperature, thereby developing the portion of exposed photopolymer and etching the portion of mask oxide layer exposed by development of photopolymer simultaneously;

removing the residual photopolymer; and etching the gate material layer and the gate oxide layer using the etched mask oxide layer.

2. The method of claim 1, wherein the photopolymer is a cinnamate type including 5-nitroacenaphthene.

3. The method of claim 1, wherein the accelerator is described by the following structural formula:

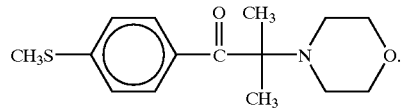

4. The method of claim 1, wherein the DFVP process is performed at a high temperature over 100° C.

* * * * *